US010651017B2

(12) United States Patent
Voronin et al.

(10) Patent No.: US 10,651,017 B2
(45) Date of Patent: May 12, 2020

(54) METHOD FOR OPERATION INSTABILITY DETECTION IN A SURFACE WAVE PLASMA SOURCE

(71) Applicant: Tokyo Electron Limited, Minato-ku, Tokyo (JP)

(72) Inventors: Sergey Voronin, Delmar, NY (US); Jason Marion, Glenville, NY (US); Alok Ranjan, Tomiya (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 436 days.

(21) Appl. No.: 15/416,422

(22) Filed: Jan. 26, 2017

(65) Prior Publication Data

US 2018/0005805 A1 Jan. 4, 2018

Related U.S. Application Data

(60) Provisional application No. 62/356,598, filed on Jun. 30, 2016.

(51) Int. Cl.
*H01J 37/32* (2006.01)
*G01N 21/73* (2006.01)
*G01N 21/88* (2006.01)
*H01L 21/3065* (2006.01)
*H01L 21/66* (2006.01)

(52) U.S. Cl.
CPC ........ *H01J 37/32935* (2013.01); *G01N 21/73* (2013.01); *G01N 21/88* (2013.01); *H01J 37/3299* (2013.01); *H01J 37/32128* (2013.01); *H01J 37/32715* (2013.01);
(Continued)

(58) Field of Classification Search
USPC .......................... 156/345.24–345.28, 345.41; 118/723 MW
See application file for complete search history.

(56) References Cited

U.S. PATENT DOCUMENTS 6,745,095 B1 * 6/2004 Ben-Dov ................ H01L 22/26
257/E21.528
8,669,705 B2 3/2014 Chen et al.
(Continued)

FOREIGN PATENT DOCUMENTS

JP 2016-38993 A 3/2016
WO 2009/101927 A1 8/2009

OTHER PUBLICATIONS

Notice of Reason(s) for Rejection dated Jun. 19, 2018 in corresponding Japanese Patent Application No. 2017-127104 (with an English translation) (6 pages).

*Primary Examiner* — Rakesh K Dhingra
(74) *Attorney, Agent, or Firm* — Rothwell, Figg, Ernst & Manbeck, P.C.

(57) ABSTRACT

Provided are methods and systems for operation instability detection in a surface wave plasma source. In an embodiment a system for plasma processing may include a surface wave plasma source configured to generate a plasma field. The system may also include an optical sensor configured to generate information characteristic of optical energy collected in a region proximate to the surface wave plasma source. Additionally, the system may include a sensor logic unit configured to detect a region of instability proximate to the surface wave plasma source in response to the information generated by the optical sensor.

16 Claims, 8 Drawing Sheets

(52) U.S. Cl.
CPC .......... *H01L 21/3065* (2013.01); *H01L 22/26* (2013.01); *H01J 2237/3341* (2013.01); *Y02P 70/605* (2015.11)

(56) References Cited

U.S. PATENT DOCUMENTS

| | | | |
|---|---|---|---|
| 2001/0015175 A1* | 8/2001 | Masuda | G01N 21/68 118/723 R |
| 2002/0115304 A1* | 8/2002 | Matsudo | H01L 21/28185 438/769 |
| 2003/0038112 A1* | 2/2003 | Liu | C23C 16/509 216/60 |
| 2006/0165873 A1* | 7/2006 | Rueger | C23C 16/45525 427/8 |
| 2006/0169410 A1* | 8/2006 | Maeda | H01J 37/32082 156/345.28 |
| 2011/0000780 A1 | 1/2011 | Tian et al. | |
| 2012/0095586 A1* | 4/2012 | Chen | H01J 37/32926 700/110 |
| 2013/0264938 A1* | 10/2013 | Chen | H01J 37/32192 315/39 |
| 2014/0028184 A1 | 1/2014 | Voronin et al. | |
| 2017/0133202 A1* | 5/2017 | Berry, III | H01J 37/3222 |
| 2017/0229332 A1 | 8/2017 | Miyama et al. | |

* cited by examiner

METHOD FOR OPERATION INSTABILITY DETECTION IN A SURFACE WAVE PLASMA SOURCE

CROSS-REFERENCE TO RELATED APPLICATIONS

Pursuant to 37 C.F.R § 1.78(a)(4), this application claims the benefit of and priority to U.S. Provisional Application No. 62/356,598, filed Jun. 30, 2016, which is expressly incorporated by reference herein in its entirety.

BACKGROUND OF THE INVENTION

Field of Invention

The present invention relates to systems and methods for substrate processing, and more particularly to a method and system for operation instability detection in a surface wave plasma source.

Description of Related Art

Surface wave plasma sources are used in various semiconductor device manufacturing processes, such as dry plasma etch processes. A plasma etch process is used to remove or etch material along fine lines or within vias or contact holes patterned on a semiconductor substrate. The plasma etch process generally involves positioning a wafer, such as a semiconductor substrate with an overlaying patterned, protective layer, for example a photoresist layer, into a processing chamber.

Once the wafer is positioned within the chamber, it is etched by introducing an ionizable, dissociative gas mixture into the chamber at a pre-specified flow rate, while adjusting a vacuum pump to achieve a processing pressure. Then, plasma is formed when a portion of the gas species is ionized by collisions with energetic electrons. The heated electrons dissociate some of the gas species in the gas mixture to create reactant species suitable for the exposed surface-etch chemistry. Once the plasma is formed, any exposed surfaces of the wafer are etched by the plasma at a rate that varies as a function of plasma density, average electron energy, and other factors.

Conventionally, various techniques have been implemented for exciting a gas into plasma for the treatment of a substrate during semiconductor device fabrication, as described above. In particular, "parallel plate" capacitively coupled plasma (CCP) processing systems, or inductively coupled plasma (ICP) processing systems have been used commonly for plasma excitation. Among other or more specific types of plasma sources, there are microwave plasma sources (including those using electron-cyclotron resonance (ECR)), surface wave plasma (SWP) sources, and helicon plasma sources.

Embodiments of SWP sources are described in further detail in U.S. Pat. App. Pub. No. 2014/0028184 entitled "Control of Uniformity in a Surface Wave Plasma Source," filed on Dec. 19, 2012, by Voronin et al., which is incorporated herein in its entirety.

In some versions, the SWP source may include a plasma distribution plate having a plurality of dimples or surface non-uniformities. The plasma field may form in regions proximate to the dimples. In some versions, the non-uniformities may include dimples having a cylindrical geometry, a conical geometry, a frusto-conical geometry, a spherical geometry, an aspherical geometry, a rectangular geometry, a pyramidal geometry, or any arbitrary shape. Various configurations of a SWP plasma distribution plate are described in U.S. Pat. No. 8,669,705 entitled "Stable Surface Wave Plasma Source," filed on Mar. 14, 2013, by Chen et al., which is incorporated herein in its entirety.

Although SWP sources generally produce more uniform plasma fields than parallel plate sources, instabilities or non-uniformities may still exist, particularly at lower power levels. For example, there may be some non-uniformity in the plasma field in regions proximate some, but not all of the dimples in the plasma distribution plate. Indeed, the plasma generation in some dimples may be much more efficient that in the others, which results in non-uniform, but "operationally stable," plasma distribution. Such non-uniformities may be difficult to detect by means of electrical signal analysis (such as reflected power, matching network stability, etc.), but may adversely affect etch parameters.

SUMMARY OF THE INVENTION

Provided are methods and systems for operation instability detection in a surface wave plasma source. In an embodiment, a system for plasma processing may include a surface wave plasma source configured to generate a plasma field. The system may also include an optical sensor configured to generate information characteristic of optical energy collected in a region proximate to the surface wave plasma source. Additionally, the system may include a sensor logic unit configured to detect a region of instability proximate to the surface wave plasma source in response to the information generated by the optical sensor.

In an embodiment, a method for plasma processing may include generating a plasma field with a surface wave plasma source. The method may also include generating information characteristic of optical energy collected in a region proximate to the surface wave plasma source with an optical sensor. Also, the method may include detecting, with a sensor logic unit, a region of instability proximate to the surface wave plasma source in response to the information generated by the optical sensor.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Figure 1:
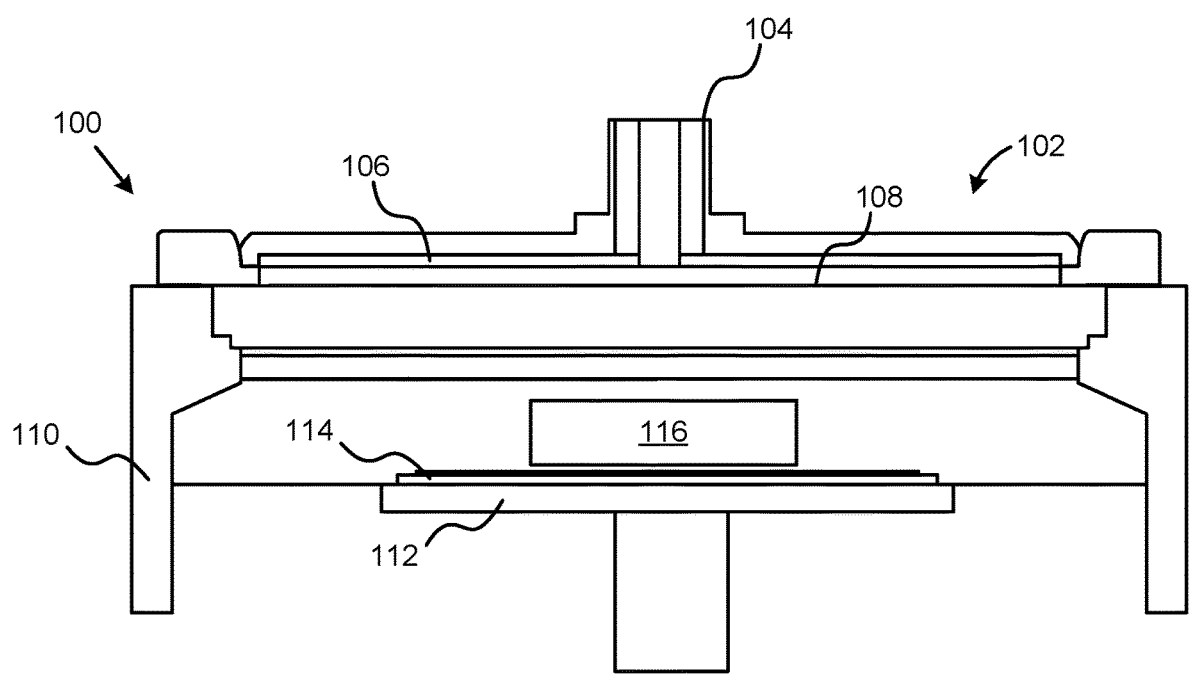
FIG. 1 illustrates one embodiment of a system for semiconductor processing.

Methods and system for operation instability detection in a surface wave plasma source. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "wafer" means and includes a base material or construction upon which materials are formed. It will be appreciated that the wafer may include a single material, a plurality of layers of different materials, a layer or layers having regions of different materials or different structures in them, etc. These materials may include semiconductors, insulators, conductors, or combinations thereof. For example, the wafer may be a semiconductor wafer, a base semiconductor layer on a supporting structure, a metal electrode or a semiconductor wafer having one or more layers, structures or regions formed thereon. The wafer may be a conventional silicon wafer or other bulk wafer comprising a layer of semi-conductive material. As used herein, the term "bulk wafer" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Referring now to the drawings, where like reference numerals designate identical or corresponding parts throughout the several views.

FIG. 1 illustrates one embodiment of a system 100 for semiconductor processing. In an embodiment, the system 100 may be configured for plasma etch. In particular, the system 100 may be a dry plasma etch system or Dry Reactive Ion Etch (DRIE) system. In an embodiment, the system 100 may include a plasma source 102. In an embodiment, the plasma source 102 may be a surface wave plasma source. Alternatively, the plasma source 102 may be an array of helical or inductively coupled plasma sources. In such an embodiment, the plasma source 102 may include an RF feed assembly 104 coupled to a source plate 106. The source plate 106 may be disposed adjacent a plasma distribution plate 108.

The plasma source 102 may be coupled to a plasma etch chamber 110. A wafer support 112 may be disposed within the plasma etch chamber 110 and configured to support a wafer 114 for processing. In a further embodiment, the plasma source 102 may generate a plasma field 116 within the plasma etch chamber 110 for bombarding the wafer 114 with etchant ions. In further embodiments, the plasma field 116 may be controlled by a vacuum pump (not shown) coupled to the chamber, an RF power source (not shown) and source controller (not shown), etc. Certain additional elements of the system 100 are not shown or described for simplification of the present description, however one of ordinary skill will recognize several additional components which may be used in accordance with the present embodiments.

Figure 2:
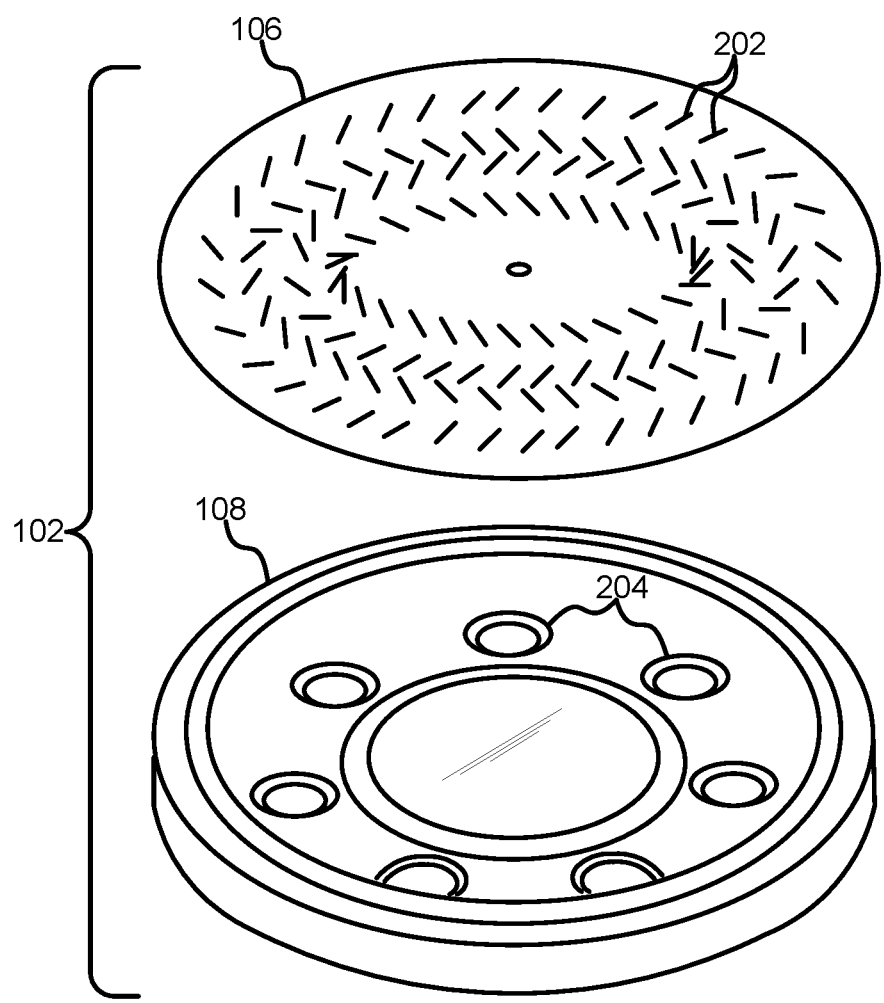
FIG. 2 is an exploded view diagram illustrating one embodiment of a surface wave plasma source according to one embodiment of a system for semiconductor processing.

FIG. 2 is an exploded view diagram illustrating one embodiment of a plasma source 102 for semiconductor processing. In an embodiment, the plasma source 102 may include a source plate 106 having a plurality of slots 202 arranged along predetermined radial lines. The source plate 106 may be disposed adjacent to the plasma distribution plate 108. In an embodiment, the plasma distribution plate 108 may include a surface having a plurality of regions of non-uniformity. In one embodiment, the regions of non-uniformity may be dimples 204.

Figure 3:
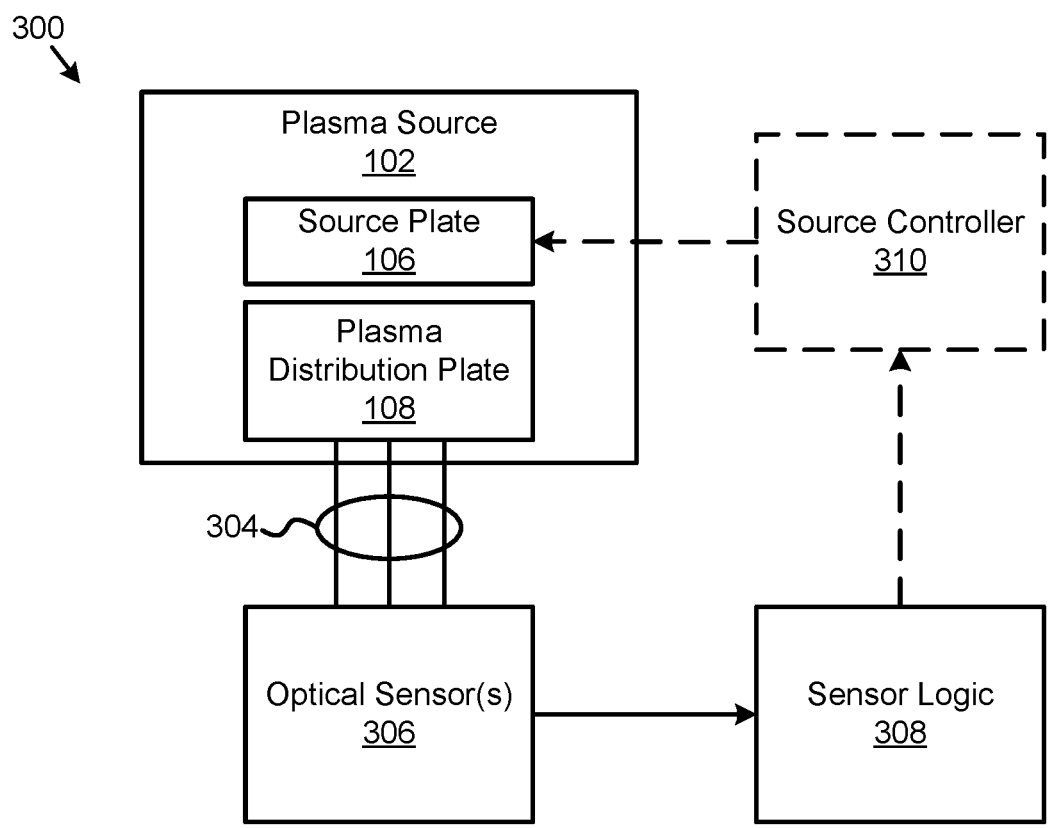
FIG. 3 is a schematic block diagram illustrating one embodiment of a system for operation instability detection in a surface wave plasma source.

FIG. 3 is a schematic block diagram illustrating one embodiment of a system for operation instability detection in a plasma source 102. In an embodiment, the system 300 includes a plasma source 102 comprising a source plate 106 and a plasma distribution plate 108. In an embodiment, one or more connectors 304 may connect one or more optical sensors 306 to the plasma source 102. In an embodiment, the one or more optical sensors 306 may be configured to generate information characteristic of optical energy collected in a region proximate to the plasma source 102. The optical sensors 306 may be configured to detect photons at a wavelength corresponding to the wavelength of the photons emitted by the plasma field 116 as shown in FIG. 1. For example, the optical sensors 306 may be configured to detect optical energy at Ultraviolet (UV) and/or Extreme Ultraviolet (EUV) wavelengths.

Figure 5:
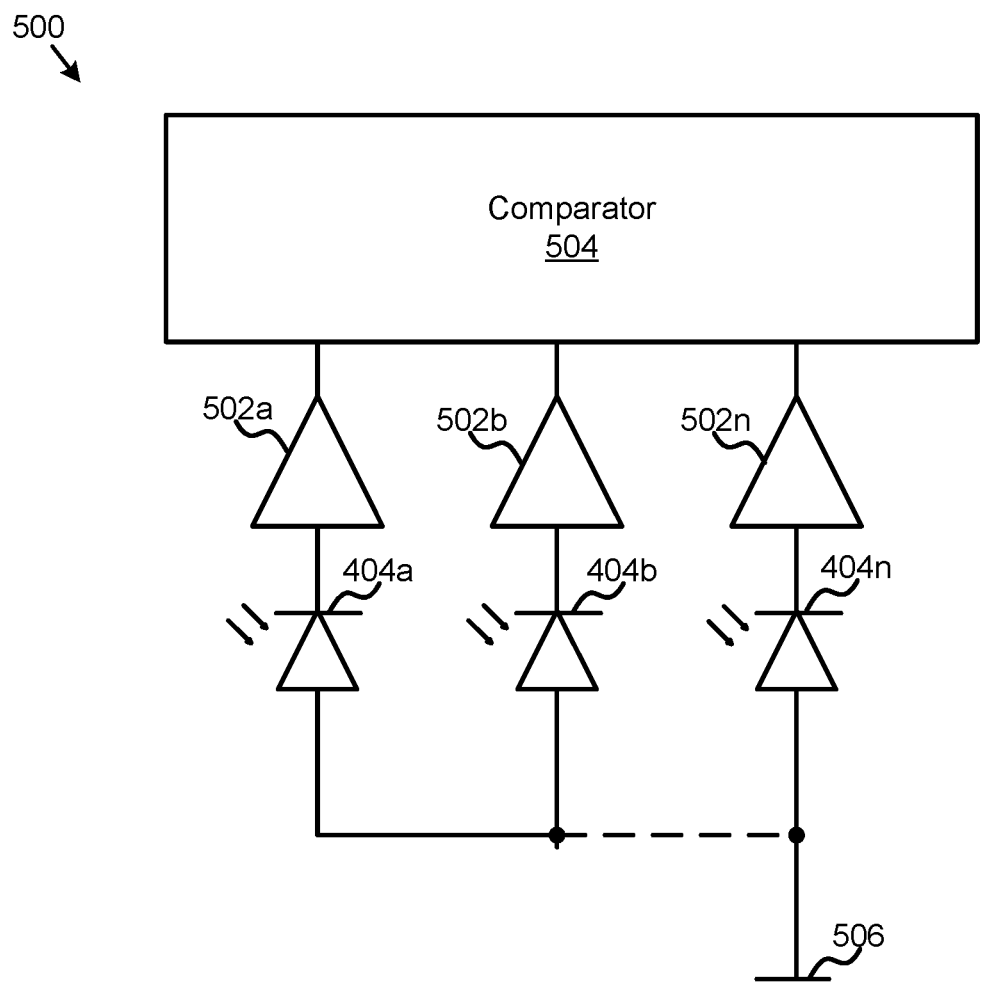
FIG. 5 is a schematic diagram illustrating one embodiment of a system for operation instability detection in a surface wave plasma source.

Sensor logic 308 may be coupled to the optical sensors 306 and configured to detect a region of instability proximate to the plasma source 102 in response to information generated by the optical sensor(s) 306. For example, sensor signal data may be generated by a comparator and further analyzed by a programmable logic chip (PLC) (not shown) of the process tool as shown in FIG. 5. If the difference between the compared signals exceeds a particular threshold or set parameter, then the PLC may flag a warning or alarm status. In the event of an alarm status, the plasma source 102 may be switched off immediately. Optionally, the feedback from the sensor logic 308 may be provided to a source controller 310 for adjusting a parameter of RF power supplied to the plasma source 102. One of ordinary skill will recognize that the source controller 310 may be implemented in the PLC of the processing tool.

Figure 4:
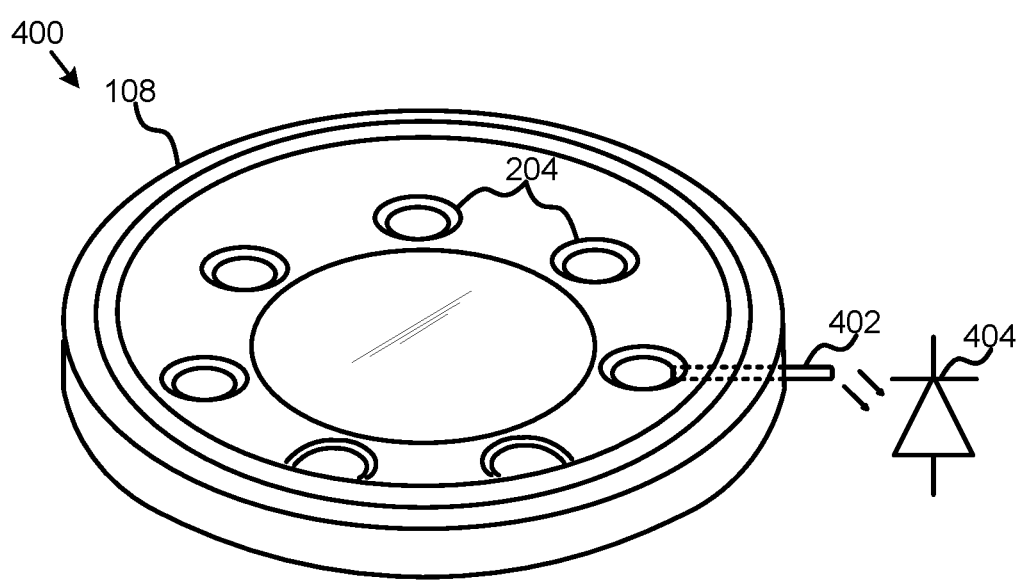
FIG. 4 is a schematic diagram illustrating one embodiment of a system for operation instability detection in a surface wave plasma source.

FIG. 4 is a schematic diagram illustrating one embodiment system 400 for operation instability detection in a plasma source 102 as shown in FIG. 1. In an embodiment, an optical fiber 402 may be disposed in a region proximate a dimple 204 formed in a surface of the plasma distribution plate 108. The optical fiber 402 may be configured to collect the optical energy from plasma generated in the region proximate to the dimple 204 formed in the surface of the plasma distribution plate 108.

Optical energy collected by the optical fiber 402 from the region proximate to the dimple 204 may be transmitted along a length of the optical fiber 402 and emitted at a second end, which is disposed proximate an optical sensor 404. The optical sensor 404 may convert the optical energy into a signal which is received by the sensor logic 308 as shown in FIGS. 3 and 5. Embodiments of an optical sensor 404 may include photodiodes, photo-electron multipliers, or the like. In an embodiment the optical fiber 402 may be disposed along an internal axis of the plasma distribution plate 108. For example, the first end of the optical fiber 402 may be disposed at or near an interior surface of the dimple 204 for collecting the optical energy proximate to the dimple 204. The optical fiber 402 may run internal to the body of the plasma distribution plate 108 and extend outward from an outer edge of the plate as illustrated in FIG. 4. In a further embodiment, a plurality of optical fibers 402 may be coupled to the plasma distribution plate 108, each optical fiber 402 being disposed proximate to one of the dimples 204.

By way of example, in embodiments where there are anywhere from 1 to 10 dimples 204 in the plasma distribution plate 108, there may similarly be 1 to 10 optical fibers 402, each optical fiber 402 interfacing a dimple 204 region. In the embodiment illustrated, the plasma distribution plate 108 includes seven dimples 204. In such an embodiment, the system 400 may include seven optical fibers 402, each coupled to a separate optical sensor 404. Further embodiments are illustrated in FIG. 5. Alternatively, other embodiments may use 11 to 50 dimples and 11 to 50 optical fibers.

FIG. 5 is a schematic diagram illustrating one embodiment of a system 500 for operation instability detection in a plasma source 102 as shown in FIG. 1. In an embodiment, a plurality of optical sensors 404a-n may receive optical energy from a plurality of optical fibers 402, as shown in FIG. 4. In one embodiment, the system 500 includes a plurality of amplifiers 502a-n, each configured to amplify a sensor signal 506 generated by a respective optical sensors 404a-n. Alternatively, a single amplifier circuit (not shown) may amplify the sensor signals. The comparator 504 may be configured to compare a sensor signal 506 generated by the optical sensors 404a-n to a reference signal. Alternatively, the comparator 504 may compare the plurality of received sensor signals against each other. In still another embodiment, the plurality of sensor signals may each be compared against a reference signal. If a difference between compared signals is over a threshold value, then an instability of plasma field anomaly may be identified. In certain embodiments, such information may be provided as feedback to a source controller 310 as shown in FIG. 3 for dynamic control of the plasma source 102. In some embodiments, the comparator 504 may be integrated with the source controller 310. In such embodiments, the comparator 504 may be an integrated part of the process tool PLC or other built-in controller of the plasma source. In an embodiment, dynamic control of the plasma sources includes sending a signal 506 to the source controller 310 of FIG. 3. The sensor signal 506 can be a notification to the operator or an alarm that indicates an instability of the plasma field exists.

Figure 6:
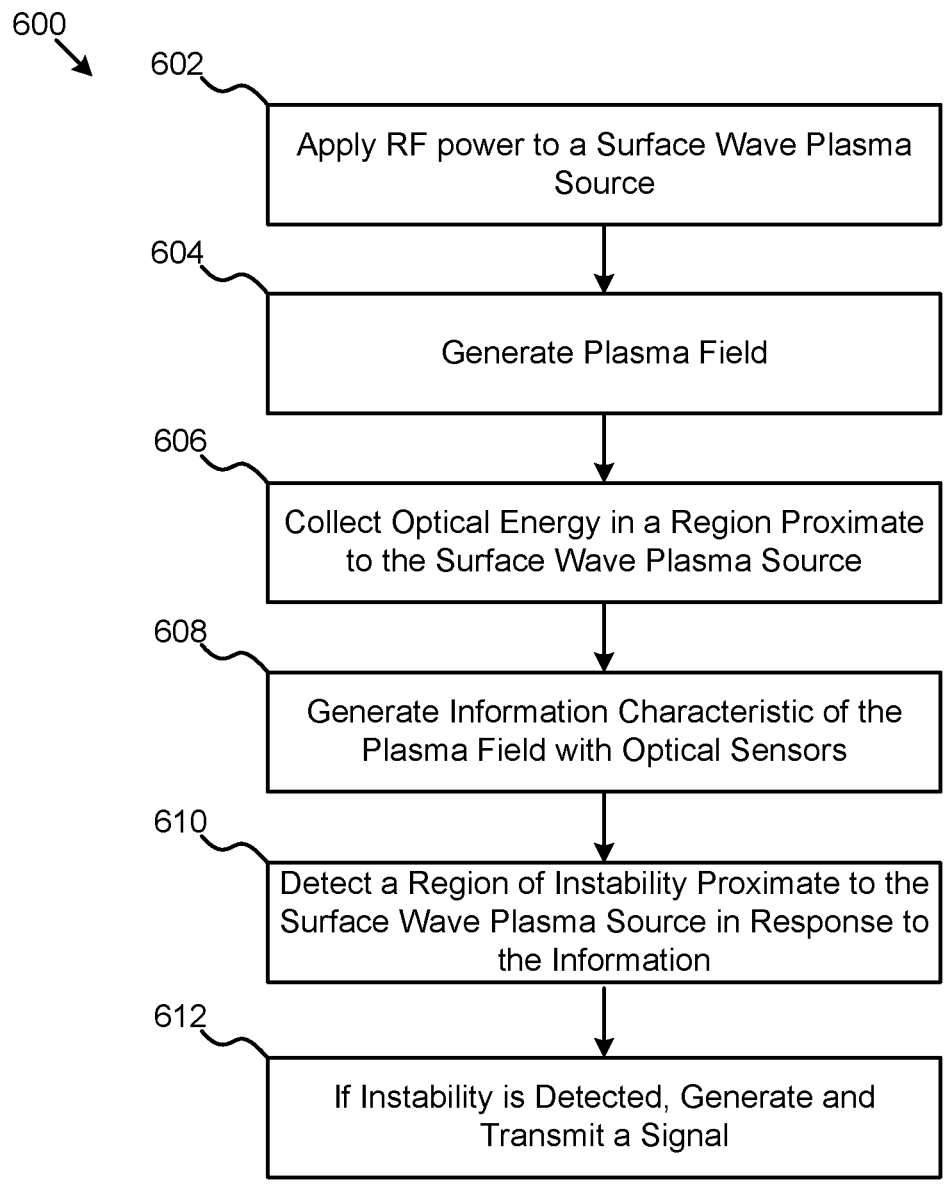
FIG. 6 is a schematic flowchart diagram illustrating one embodiment of a method for operation instability detection in a surface wave plasma source.

FIG. 6 is a schematic flowchart diagram illustrating one embodiment of a method 600 for operation instability detection in a plasma source 102. In an embodiment, the method 600 includes applying RF power to a surface wave plasma source at block 602. At block 604, the method 600 includes generating a plasma field with the plasma source. At block 606, the method 600 includes collecting optical energy in a region proximate to the source. The sensors may generate information characteristic of the plasma field with optical sensors at block 608. At block 610, the method 600 may include detecting a region of instability proximate to the plasma source in response to the information. At block 612, if instability is detected, the method may include generating and transmitting a sensor signal. In an embodiment, the sensor signal may include an alarm or a communication to the system or operator.

Figure 7A:
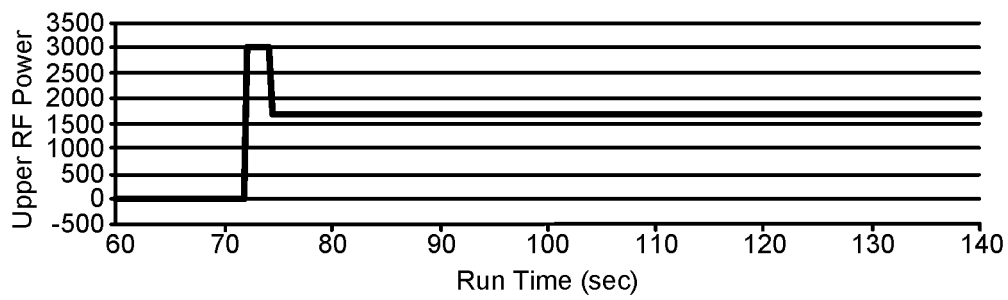
FIG. 7A illustrates data representative of a Radio Frequency (RF) power supplied for a plasma etch process conducted at 1700 W.
Figure 7B:
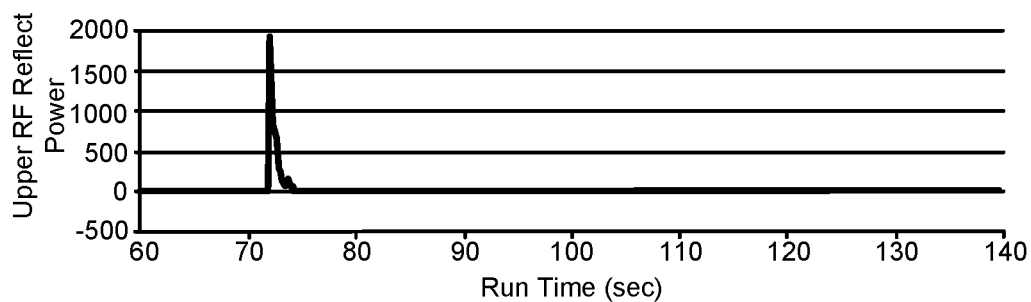
FIG. 7B illustrates data representative of a reflected RF power.
Figure 7C:
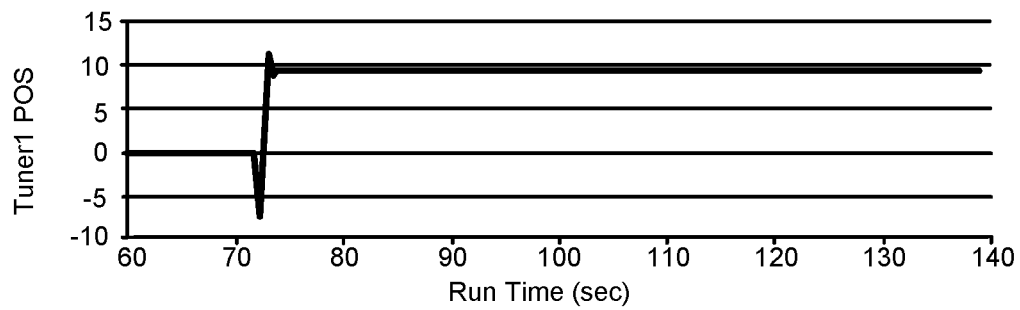
FIG. 7C illustrates data representative of a first tuner position during an etch process conducted at 1700 W.
Figure 7D:
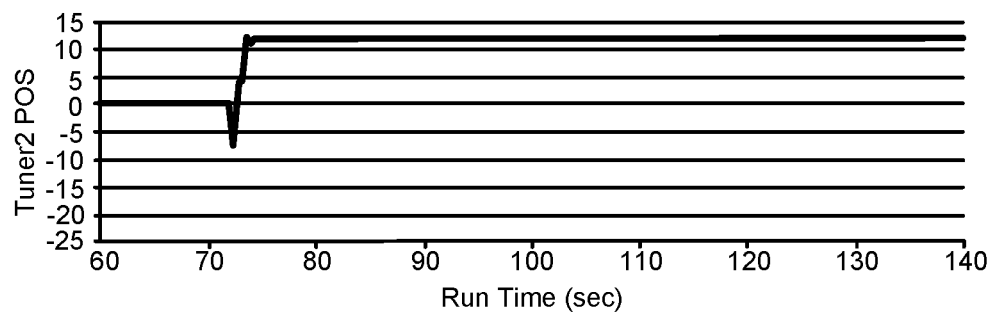
FIG. 7D illustrates data representative of a second tuner position during an etch process conducted at 1700 W.

FIGS. 7A, 7B, 7C, and 7D illustrate data representative of a process log showing a stable plasma field generated by a plasma source 102 as shown in FIG. 1 driven at 700 W. FIG. 7A illustrates the upper RF power supplied to the plasma source 102. FIG. 7B illustrates the upper RF reflection power from the source plate 106. FIG. 7C illustrates a first plasma impedance matching network tuner position and FIG. 7D illustrates a second tuner position. The first and second tuners may be RF impedance matching circuits, and the fact that the graphs are level after initial startup indicates that the system is stable.

Figure 8A:
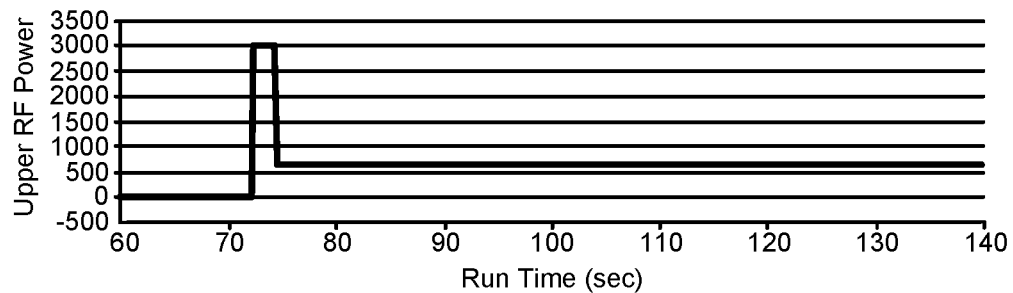
FIG. 8A illustrates data representative of an RF power supplied for a plasma etch process conducted at 700 W.
Figure 8B:
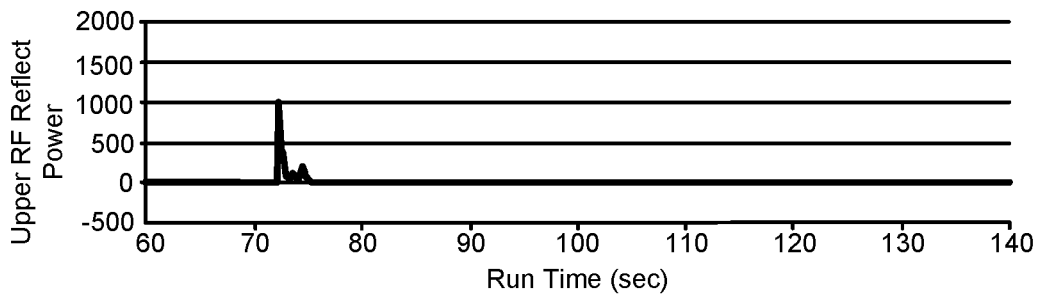
FIG. 8B illustrates data representative of a reflected RF power.
Figure 8C:
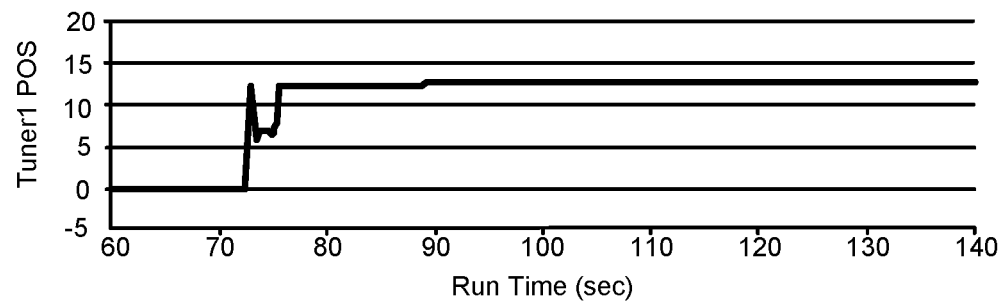
FIG. 8C illustrates data representative of a first tuner position during an etch process conducted at 700 W.
Figure 8D:
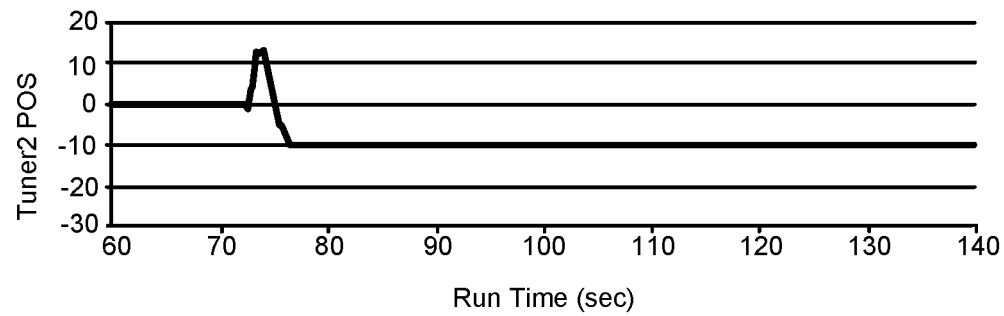
FIG. 8D illustrates data representative of a second tuner position during an etch process conducted at 700 W.

FIGS. 8A, 8B, 8C, and 8D illustrate data representative of a process log showing a non-stable plasma field generated by a plasma source 102 driven at 700 W. Similarly, FIGS. 8A and 8B illustrate the upper RF power and reflection power respectively and FIGS. 8C and 8D illustrate tuner positions. Although the tuner position graphs indicate overall process stability, during testing the light intensity in a few dimples was extremely low compared to the others. This inconsistency is illustrative of the fact that it is very difficult to identify plasma instabilities from the data alone, and further illustrates the need for optical sensing as described in the present embodiments.

Additional advantages and modifications will readily appear to those skilled in the art. The invention in its broader aspects is therefore not limited to the specific details, representative apparatus and method, and illustrative examples

What we claim:

1. A system for plasma processing comprising:
   a surface wave plasma source configured to generate a plasma field;
   wherein the surface wave plasma source further comprises a plasma distribution plate having a plurality of regions of non-uniformity on a surface of the plasma distribution plate, wherein the plurality of regions of non-uniformity comprise dimples formed on the surface of the plasma distribution plate;
   a plurality of optical sensors configured to generate information characteristic of optical energy collected by way of a plurality of optical fibers each disposed on an interior surface of a respective one of the dimples; and
   a sensor logic unit configured to detect a region of instability in response to the information generated by the plurality of optical sensors,
   wherein the sensor logic unit comprises a comparator, and wherein the sensor logic unit generates an instability signal in response to a determination that:
   (i) a difference between a sensor signal of one of the optical sensors and a reference signal exceeds a threshold value, or
   (ii) a difference between one sensor signal of one of the optical sensors and another sensor signal of another of the optical sensors exceeds a threshold value.

2. The system of claim 1 wherein the plurality of regions of non-uniformity comprise dimples formed on the surface of the plasma distribution plate.

3. The system of claim 1 wherein the sensor logic unit comprises an amplifier.

4. The system of claim 1 wherein the sensor logic unit comprises a plurality of amplifiers, each configured to amplify a signal generated by one of the plurality of optical sensors.

5. The system of claim 1 wherein the comparator is configured to compare a plurality of sensor signals with the reference signal, each sensor signal being generated by one of the plurality of optical sensors.

6. The system of claim 1 further comprising a source controller, the source controller configured to control a parameter of power supplied to the surface wave plasma source in response to feedback received from the sensor logic unit.

7. The system of claim 1 further comprising a plasma etch chamber coupled to the surface wave plasma source, the plasma etch chamber being configured to contain a plasma field generated by the surface wave plasma source and a wafer support disposed within the plasma etch chamber, the wafer support configured to receive a semiconductor wafer for processing.

8. The system of claim 1, wherein the instability signal includes a notification to an operator or an alarm.

9. A system for plasma processing comprising:
   a surface wave plasma source configured to generate a plasma field;
   at least one optical sensor configured to generate information characteristic of optical energy collected in a region proximate to the surface wave plasma source;
   a sensor logic unit configured to detect a region of instability proximate to the surface wave plasma source in response to the information generated by the at least one optical sensor;
   wherein the surface wave plasma source further comprises a plasma distribution plate having a plurality of regions of non-uniformity on a surface of the plasma distribution plate:
   wherein the plurality of regions of non-uniformity comprise dimples formed on the surface of the plasma distribution plate; and
   the system further comprising plural optical fibers coupled to the plasma distribution plate and disposed in regions proximate different ones of the dimples formed on the surface of the plasma distribution plate, and the optical fibers are configured to collect the optical energy from plasma generated in the regions proximate to the dimples formed on the surface of the plasma distribution plate, wherein a first end of each of the optical fibers is disposed on an interior surface of a respective one of the dimples.

10. The system of claim 9 wherein the at least one optical sensor comprises a light sensitive diode disposed proximate to the optical fibers.

11. The system of claim 10 wherein the at least one optical sensor comprises a plurality of light sensitive diodes disposed proximate one end of each of the plurality of optical fibers.

12. The system of claim 9 wherein at least one of the optical fibers is disposed along an internal axis of the plasma distribution plate.

13. The system of claim 9, wherein the at least one optical sensor generates plural sensor signals corresponding to the optical energy collected at the different regions proximate different ones of the dimples, and the sensor logic generates an instability signal in response to a determination that:
    (i) a difference between one of the plurality of sensor signals and a reference signal exceeds a threshold value, or
    (ii) a difference between one of the plurality of sensor signals and another of the plurality of sensor signals exceeds a threshold value.

14. A method for plasma processing comprising:
    generating a plasma field with a surface wave plasma source;
    generating information characteristic of optical energy collected in a region proximate to the surface wave plasma source with at least one optical sensor;
    detecting, with a sensor logic unit, a region of instability proximate to the surface wave plasma source in response to the information generated by the at least one optical sensor;
    wherein the generating information includes collecting information pertaining to optical energy at plural different regions proximate to the surface wave plasma source and providing the information from the plural different regions to the at least one optical sensor, and the at least one optical sensor generates sensor signals corresponding to the information collected at the plural different regions proximate to the surface wave plasma source;
    wherein the surface wave plasma source includes a plasma distribution plate having plural regions of non-uniformity, wherein the plurality of regions of non-uniformity comprise dimples formed on the surface of the plasma distribution plate, and the collecting information at plural different regions includes collecting information by way of a plurality of optical fibers each disposed on an interior surface of a respective one of the dimples; and the method further including generating an instability signal in response to a determination of at least one of:

(i) a difference between a sensor signal and a reference signal exceeds a threshold value, or (ii) a difference between a sensor signal corresponding to one region of the plural regions of non-uniformity and another sensor signal corresponding to another region of the plural regions of non-uniformity exceeds a threshold value.

15. The method of claim 14, wherein the instability signal includes a notification sent to an operator or an alarm.

16. The method according to claim 14, wherein the plural optical fibers are connected to the at least one optical sensor.

* * * * *